(12) United States Patent
Inouchi et al.

(10) Patent No.: US 8,604,683 B2
(45) Date of Patent: Dec. 10, 2013

(54) BUCKET-TYPE ION SOURCE FOR FANNING CUSPED MAGNETIC FIELDS INSIDE A PLASMA GENERATION CHAMBER

(75) Inventors: Yutaka Inouchi, Kyoto (JP); Takeshi Matsumoto, Kyoto (JP); Masahiro Tanii, Kyoto (JP); Katsuharu Imai, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 13/416,369

(22) Filed: Mar. 9, 2012

(65) Prior Publication Data
US 2012/0229012 A1 Sep. 13, 2012

(30) Foreign Application Priority Data
Mar. 10, 2011 (JP) .................................. 2011-053396

(51) Int. Cl.
*H01J 27/02* (2006.01)
(52) U.S. Cl.
USPC ...................................................... 313/363.1
(58) Field of Classification Search
USPC ...................................................... 313/363.1
See application file for complete search history.

(56) References Cited

U.S. PATENT DOCUMENTS
3,032,490 A * 5/1962 Simon ........................... 376/130

FOREIGN PATENT DOCUMENTS
JP  05-182623 A  7/1993
JP  2007-115511 A  5/2007

OTHER PUBLICATIONS
English translation of JP 05-182623 (Jul. 23, 1993).*
Patent Abstracts of Japan, Publication No. 05-182623, dated Jul. 23, 1993, 1 page.
Patent Abstracts of Japan, Publication No. 2007-115511, dated May 10, 2007, 1 page.

* cited by examiner

*Primary Examiner* — Anh Mai
*Assistant Examiner* — Hana Featherly
(74) *Attorney, Agent, or Firm* — Osha Liang LLP

(57) ABSTRACT

An ion source includes a plasma generation chamber, at least one filament disposed inside the plasma generation chamber, at least one electrode disposed so as to be opposed to the plasma generation chamber, and configured to extract out an ion beam from the plasma generation chamber, and a plurality of permanent magnets disposed outside the plasma generation chamber, and configured to form cusped magnetic fields inside the plasma generation chamber, and a deposition preventive plate disposed parallel with an inner surface of a wall of the plasma generation chamber. The deposition preventive plate has recesses which are formed at such positions as to be opposed to the respective permanent magnets with the wall of the plasma generation chamber interposed in between.

6 Claims, 8 Drawing Sheets

BUCKET-TYPE ION SOURCE FOR FANNING CUSPED MAGNETIC FIELDS INSIDE A PLASMA GENERATION CHAMBER

CROSS REFERENCE TO RELATED APPLICATION(S)

This application is based upon and claims the benefit of priority from Japanese Patent Application No. 2011-53396 filed on Mar. 10, 2011, the entire contents of which are incorporated herein by reference.

TECHNICAL FIELD

The present disclosure relates to an ion source which is equipped with permanent magnets for fanning cusped magnetic fields inside a plasma generation chamber. More particularly, the present disclosure relates to an ion source which is equipped with deposition preventive plates inside a plasma generation chamber.

RELATED ART

In ion sources, as disclosed in FIG. 3 of Patent document 1, linings (also called liners or deposition preventive plates) which are uniform in thickness and detachable are provided parallel with inner wall surfaces of a plasma generation chamber to prevent corrosion of the inner wall surfaces and efficiently clean the inside of the plasma generation chamber.

Among ion sources used in ion beam irradiation apparatus is one which is provided with permanent magnets for forming cusped magnetic fields for electron confinement inside a plasma generation chamber.

In this type of ion source which is generally called a bucket-type ion source, as disclosed in FIG. 2 of Patent document 2, for example, it has also been attempted to dispose deposition preventive plates inside a plasma generation chamber.

PRIOR ART DOCUMENTS

Patent Documents

[Patent document 1] JP-A-5-182623 (FIG. 3)
[Patent document 2] JP-A-2007-115511 (FIG. 2)

FIG. 8A shows how electrons e move in cusped magnetic fields formed in the vicinity of a wall surface of a plasma generation chamber 4 of the ion source that is disclosed in Patent document 2. In FIG. 8A, broken lines indicate magnetic field lines and solid lines indicate electron movements.

An electron e that has been generated by a filament (not shown) disposed inside the plasma generation chamber 4 and has come close to the wall surface of the plasma generation chamber 4 is captured by a cusped magnetic field formed in the vicinity of the wall surface of the plasma generation chamber 4 and is thereby caused to move along a magnetic field line. After coming to a position having a certain distance from a permanent magnet 12, the electron e that has traveled toward the wall surface of the plasma generation chamber 4 so far comes to go away from the wall surface.

Such a change in the traveling direction of an electron e occurs when it moves from a region where the magnetic field is weak to a region where the magnetic field is strong. In general, such a change in traveling direction occurs when the ratio $Bm/Bo$ of the strength $Bm$ of a strong magnetic field portion to the strength $Bo$ of a weak magnetic field portion (Mirror ratio) exceeds a certain value. Since the magnetic field becomes stronger as the position comes closer to a permanent magnet 12, the traveling direction of an electron e is changed in the vicinity of the permanent magnet 12.

FIG. 8B shows how an electron e moves in a cusped magnetic field formed in the vicinity of an inner wall surface of a plasma generation chamber 4 of the ion source that is disclosed in Patent document 2 in a case that a deposition preventive plate 21 which is uniform in thickness is disposed parallel with the inner wall of the plasma generation chamber 4. As in FIG. 8A, broken lines indicate magnetic field lines and solid lines indicate electron movements.

In this case, the space of the cusped magnetic fields for capturing electrons e is narrowed by the thickness of the deposition preventive plate 21 and its boundary is more distant from permanent magnets 12 than in the configuration of FIG. 8A. Since the magnetic field becomes stronger as the position comes closer to the permanent magnets 12, electrons e come to be captured only in a space that is more distant from the permanent magnets 12 as the deposition preventive plate 21 becomes thicker. When the deposition preventive plate 21 is thick, electrons e collide with the deposition preventive plate 21 and disappear before their traveling directions are changed from the direction toward the wall surface of the plasma generation chamber 4.

To generate plasma, it is necessary that electrons e collide with a material gas existing inside the plasma generation chamber 4. Therefore, if there are electrons e that collide with the deposition preventive plate 21 and disappear, the plasma generation efficiency is lowered.

SUMMARY

Exemplary embodiments of the invention provide an ion source which can make lower the probability of collision of electrons with deposition preventive plates and the plasma generation efficiency higher than in the related-art configuration.

An ion source according to an exemplary embodiment of the invention comprises:
a plasma generation chamber;
at least one filament disposed inside the plasma generation chamber;
at least one electrode disposed so as to be opposed to the plasma generation chamber, and configured to extract out an ion beam from the plasma generation chamber; and
a plurality of permanent magnets disposed outside the plasma generation chamber, and configured to form cusped magnetic fields inside the plasma generation chamber; and
a deposition preventive plate disposed parallel with an inner surface of a wall of the plasma generation chamber, wherein
the deposition preventive plate has recesses which are formed at such positions as to be opposed to the respective permanent magnets with the wall of the plasma generation chamber interposed in between.

This configuration can make lower the probability of collision of electrons with the deposition preventive plate and the plasma generation efficiency higher than in the related-art configuration.

The deposition preventive plate may comprise a first deposition preventive plate having counter bores which are formed at such positions as to be opposed to the respective permanent magnets with the wall of the plasma generation chamber interposed in between and second deposition preventive plates disposed inside the respective counter bores.

The deposition preventive plate may comprise a first deposition preventive plate having through-holes which are formed at such positions as to be opposed to the respective permanent magnets with the wall of the plasma generation chamber interposed in between and a second deposition preventive plate or plates which are disposed between the first deposition preventive plate and the inner wall surface of the plasma generation chamber and close the through-holes.

The second deposition preventive plate or plates may be made of a high-melting point material.

Plasma escape paths are formed in regions in the vicinities of the permanent magnets where the magnetic field is concentrated, and member portions adjacent to those regions are heated to a high temperature. Where the second deposition preventive plate is made of a high-melting point material, it is expected that thermal deformation of the second deposition preventive plate can be prevented even if it is heated to a high temperature.

Side faces of each of the recesses may be slant faces which are shaped so that the thickness of the deposition preventive plate varies continuously in a direction that is perpendicular to the inner wall surface of the plasma generation chamber.

Since this structure increases the strength of the deposition preventive plate, it is expected that a warp etc. of the deposition preventive plate due to insufficient strength can be suppressed.

According to the exemplary embodiments of the invention, it is possible to make lower the probability of collision of electrons with deposition preventive plates and the plasma generation efficiency higher than in the related-art configuration.

DETAILED DESCRIPTION

Figure 1:
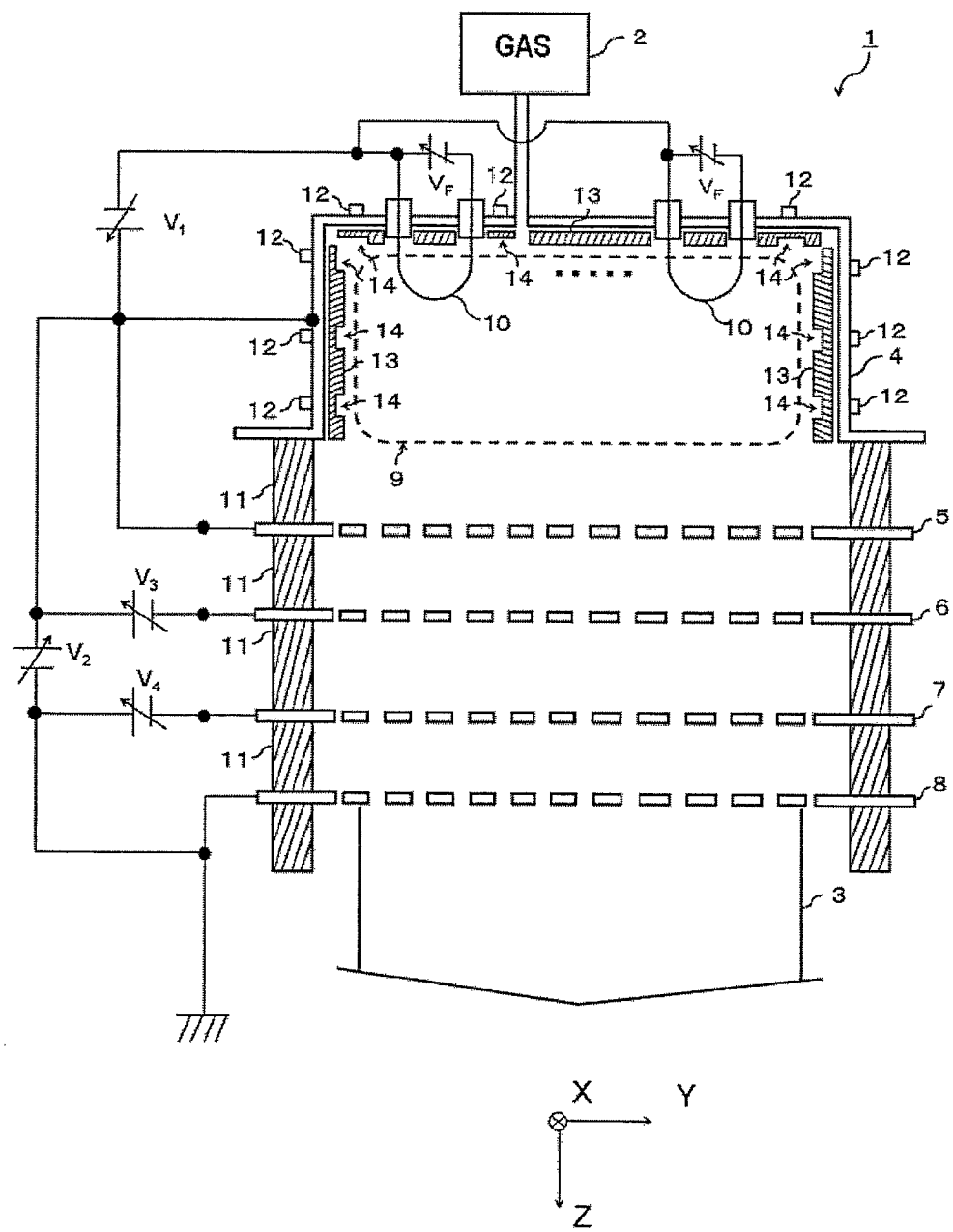
FIG. 1 is a plan view showing an ion source according to an embodiment of the invention.

FIG. 1 shows an ion source 1 according to an embodiment of the invention, which is what is called a bucket-type ion source.

The ion source 1 is equipped with a plasma generation chamber 4, and a generally ribbon-shaped ion beam 3 is extracted out from the plasma generation chamber 4.

A gas source 2 is attached to the plasma generation chamber 4 via a valve (not shown), and a material gas of the ion beam 3 is supplied from the gas source 2. A gas mass flow controller (not shown) is connected to the gas source 2, the rate of gas supply from the gas source 2 to inside the plasma generation chamber 4 is adjusted by the gas mass flow controller.

Plural U-shaped filaments 10 are attached to one side wall of the plasma generation chamber 4 so as to extend in the Y direction. The current flowing through each filament 10 can be adjusted using a power source $V_F$ which is connected between its terminals. With this configuration, the current density profile of the ion beam 3 which is output from the ion source 1 can be adjusted.

Electrons are emitted from the filaments 10 by heating the filaments by causing currents to flow through the filaments 10. The emitted electrons collide with the gas that has been supplied to inside the plasma generation chamber 4 and ionize the gas, whereby plasma 9 is generated in the plasma generation chamber 4.

In the ion source 1, plural permanent magnets 12 are attached to outer wall surfaces of the plasma generation chamber 4. Cusped magnetic field are formed inside the plasma generation chamber 4 by the permanent magnets 12, whereby electrons emitted from the filaments 10 are confined in a prescribed space.

The ion source 1 is equipped with four extraction electrodes which are an acceleration electrode 5, an extraction electrode 6, a restriction electrode 7, and a ground electrode 8 arranged in the Z direction in this order from the plasma generation chamber 4. The voltages between the filaments 10, the plasma generation chamber 4, and each of the electrodes 5-8 are set at different values by plural power sources $V_1$-$V_4$. Insulating members 11 are provided between the plasma generation chamber 4 and each of the electrodes 5-8.

Each of the extraction electrodes 5-8 is formed with plural slit-shaped openings, for example, and the ion beam 3 is extracted out through these openings. Although the ion source 1 of FIG. 1 is equipped with the four extraction electrodes 5-8, the number of extraction electrodes is not limited to four may be any number that is larger than or equal to one.

In the ion source 1, deposition preventive plates 13 are disposed inside the plasma generation chamber 4 parallel with its respective inner wall surfaces. The thickness, in the direction is approximately perpendicular to the wall of the plasma generation chamber 4, of each deposition preventive plate 13 is smaller in its portions that are opposed to the permanent magnets 12 with the wall of the plasma generation chamber 4 interposed in between than in the other portions (more specific structures will be described later). With this structure, the efficiency of generation of plasma 9 inside the plasma generation chamber 4 can be made higher than with the related-art structure.

Figure 2A:
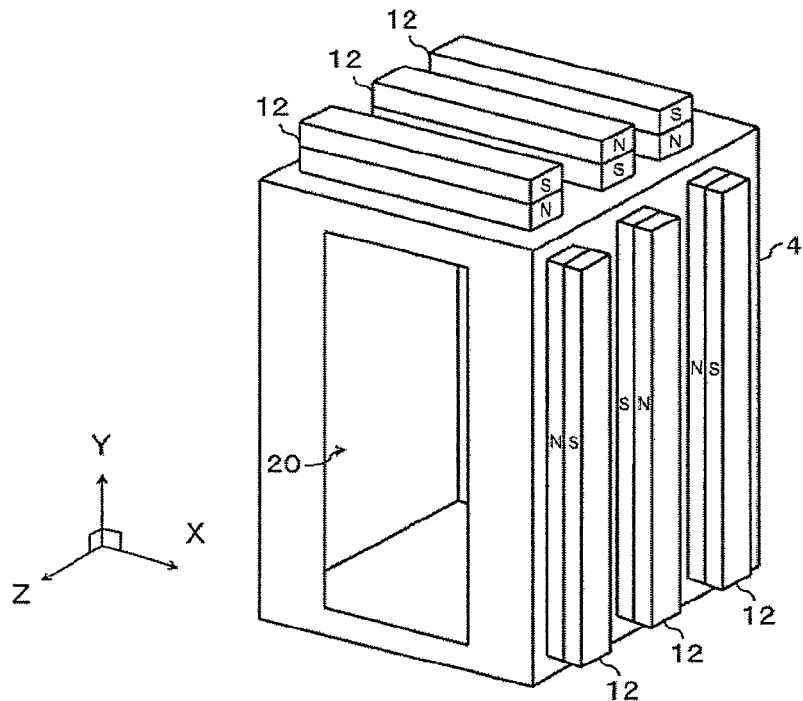
FIGS. 2A and 2B are perspective views showing how the plural permanent magnets for generation of cusped magnetic fields are disposed parallel with outer wall surfaces of a plasma generation chamber.
Figure 2B:
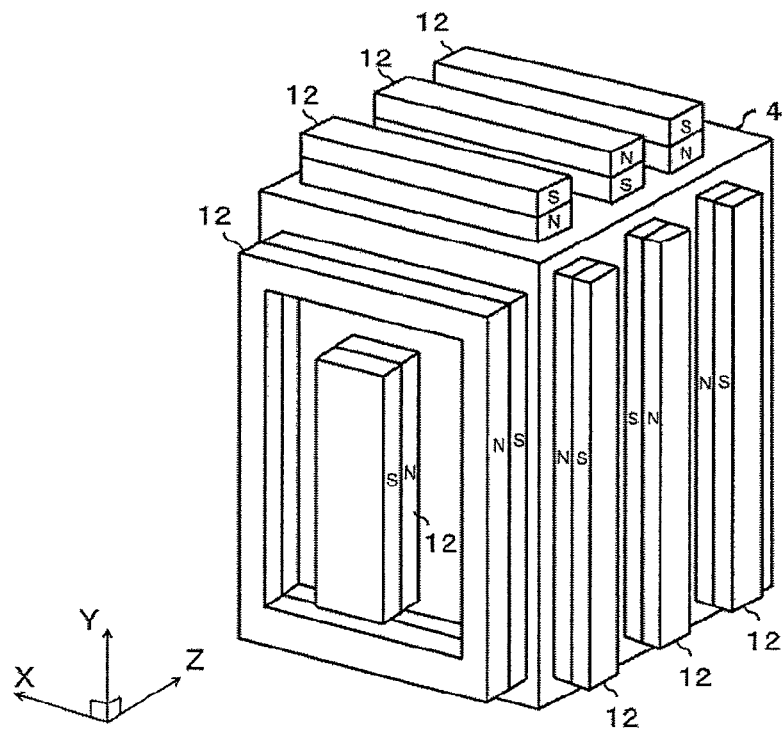

FIGS. 2A and 2B show how the plural permanent magnets 12 for generation of cusped magnetic fields are disposed parallel with outer wall surfaces of the plasma generation chamber 4. In FIGS. 2A and 2B, the plasma generation chamber 4 is viewed from different viewing points.

The plasma generation chamber 4 has a wall which is formed with an opening 20 for extraction of an ion beam 3 on the positive Z side. The permanent magnets 12 are attached to the five walls other than this wall. The permanent magnets 12 may be attached either directly or indirectly to the plasma generation chamber 4. In the indirect case, holders that house the respective permanent magnets 12 are provided and attached to the plasma generation chamber 4 with bolts or the like.

Figure 3:
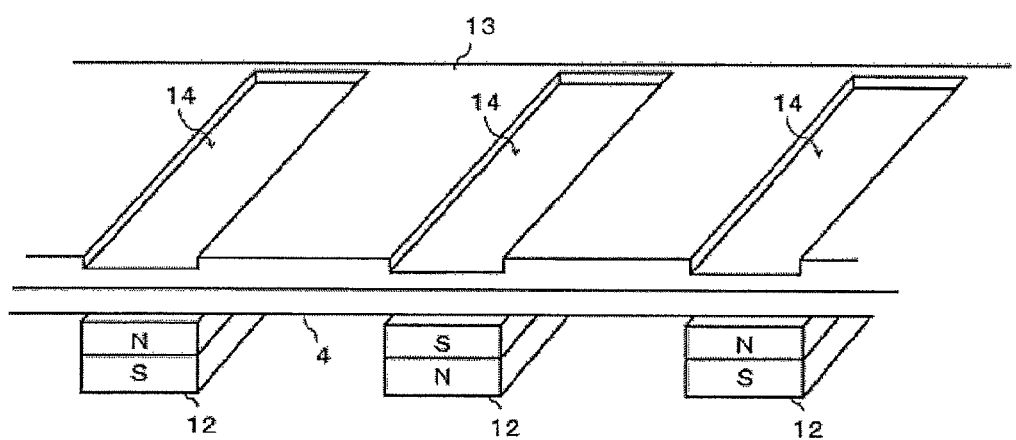
FIG. 3 is a perspective view showing a deposition preventive plate used in the embodiment of the invention.

FIG. 3 shows a deposition preventive plate 13 used in the embodiment of the invention. In this embodiment, the deposition preventive plate 13 is formed with recesses 14 at such positions as to be opposed to the permanent magnets 12 with the wall of the permanent magnets 12 interposed in between. Because of the formation of the recesses 14, the deposition preventive plate 13 is thinned and the space where electrons are captured by the cusped magnetic fields can be enlarged accordingly. As a result, the probability of collision of electrons with the deposition preventive plates 13 can be made lower and the plasma generation efficiency can be made higher than in the related-art structure which employs the deposition preventive plates 13 which are uniform in thickness. In FIG. 3 and FIGS. 4-6 (referred to later), the cross sections, drawn on the viewing side, of the deposition preventive plate 13 and the permanent magnets 12 are ones obtained when one side wall of the plasma generation chamber 4 is cut in the shorter axis direction of the permanent magnets 12.

Figure 4:
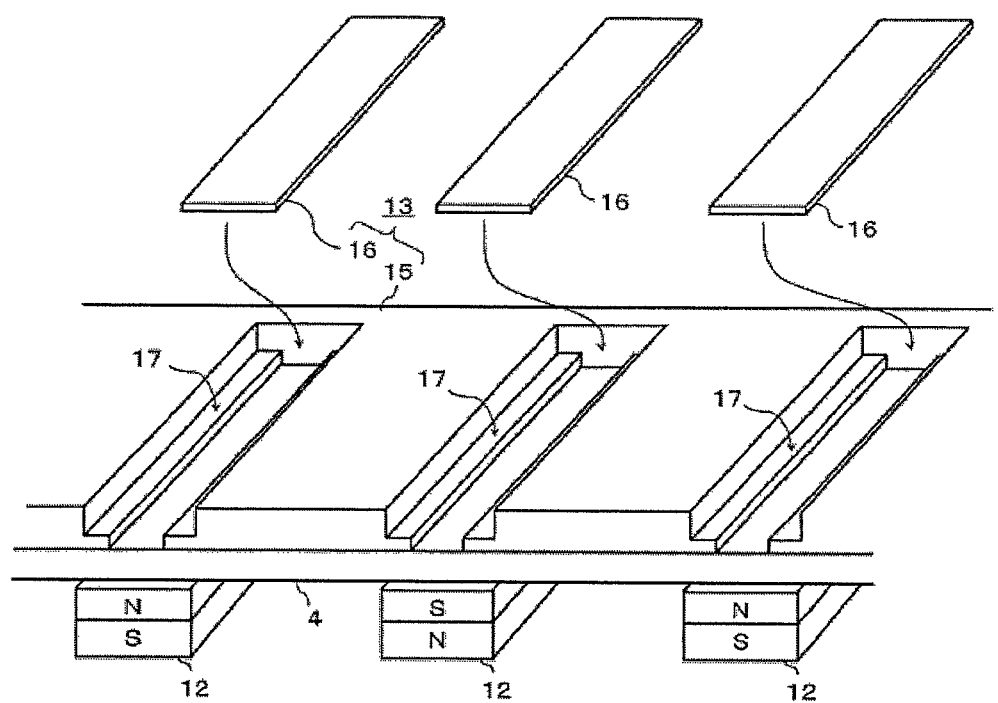
FIG. 4 is a perspective view showing a deposition preventive plate used in another embodiment of the invention.

FIG. 4 shows a deposition preventive plate 13 used in another embodiment of the invention. In this embodiment, the deposition preventive plate 13 is composed of a first deposition preventive plate 15 and second deposition preventive plates 16. The first deposition preventive plate 15 is formed with counter bore faces 17 at such positions as to be opposed to the permanent magnets 12 with the wall of the plasma generation chamber 4 interposed in between. Recesses 14 (mentioned above) are formed when the second deposition preventive plates 16 are placed on the counter bore faces 17. In this manner, each deposition preventive plate 13 may be formed by plural members.

Local plasma escape paths are formed adjacent to those portions of each deposition preventive plate 13 which are opposed to the permanent magnets 12 with the wall of the plasma generation chamber 4 interposed in between, and those portions are heated to a high temperature. Therefore, it is preferable that the second deposition preventive plates 16 as those portions be made of a high-melting-point material such as molybdenum or tungsten.

Figure 5A:
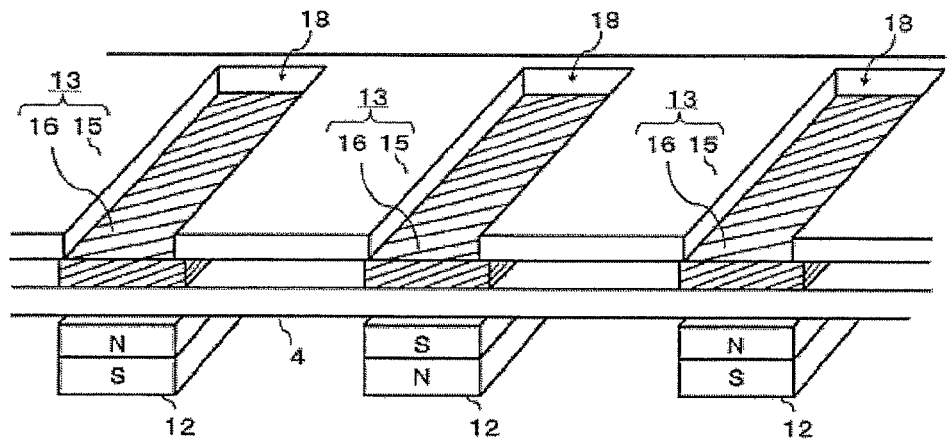
FIGS. 5A and 5B are perspective views showing deposition preventive plates used in other embodiment of the invention.
Figure 5B:
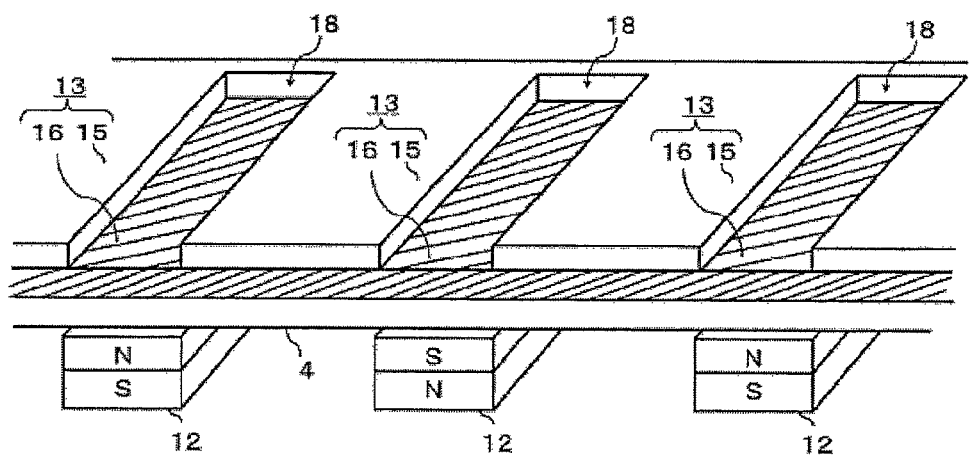

FIGS. 5A and 5B show deposition preventive plates 13 used in other embodiment of the invention. A first deposition preventive plate 15 is formed with through-holes 18 at such positions as to be opposed to the permanent magnets 12 with the wall of the plasma generation chamber 4 interposed in between. A second deposition preventive plate(s) 16 is disposed between the first deposition preventive plate 15 and the wall of the plasma generation chamber 4 so as to close the through-holes 18. Thus, recesses 14 (mentioned above) are formed.

In the embodiment of FIG. 5A, the second deposition preventive plates 16 are disposed to as to close the respective through-holes 18. In the embodiment of FIG. 5B, the large second deposition preventive plate closes the plural through-holes 18 together. The deposition preventive plate 13 of FIG. 5B is simpler in structure. As in the embodiment of FIG. 4, it is preferable that the second deposition preventive plate(s) 16 be made of a high-melting-point material.

<Modification>

Figure 6:
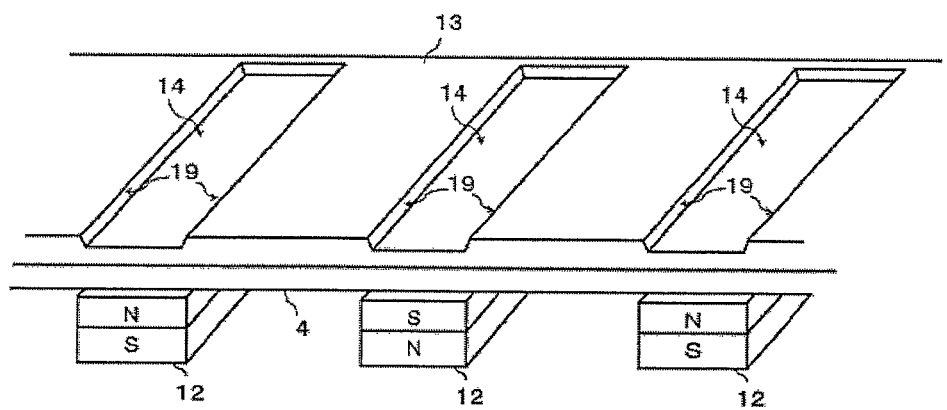
FIG. 6 is a perspective view showing a modification of the deposition preventive plate shown in FIG. 3.

FIG. 6 shows a modification of the deposition preventive plate 13 shown in FIG. 3. The deposition preventive plate 13 according to this modification is the same in structure as the deposition preventive plate 13 shown in FIG. 3 except the following. Whereas each recess 14 of the deposition preventive plate 13 shown in FIG. 6 has slant faces 19, each recess 14 of the deposition preventive plate 13 shown in FIG. 3 has no such slant faces. Each slant face 19 is formed in such a manner that the thickness of the deposition preventive plate 13 in the direction perpendicular to the wall surface of the plasma generation chamber 4 decreases gradually as the position comes closer to the permanent magnet 12 in that direction.

The cusped magnetic fields extend approximately radially from the permanent magnets 12. In the vicinity of the wall surface of the plasma generation chamber 4, electrons move along magnetic field lines of the cusped magnetic fields. Therefore, it is appropriate that each deposition preventive plate 13 be shaped so as to avoid the radial cusped magnetic fields and thereby avoid obstructing movement of electrons.

Figure 7A:
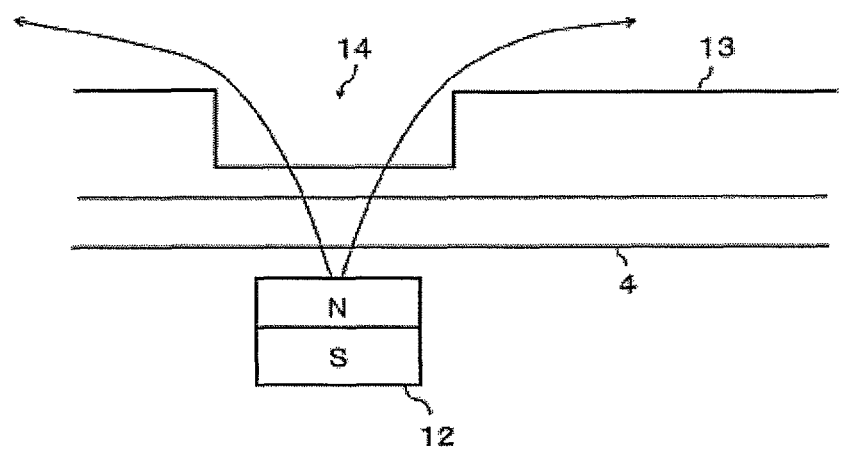
FIG. 7A is an enlarged view of the deposition preventive plate 13 shown in FIG. 3.
Figure 7B:
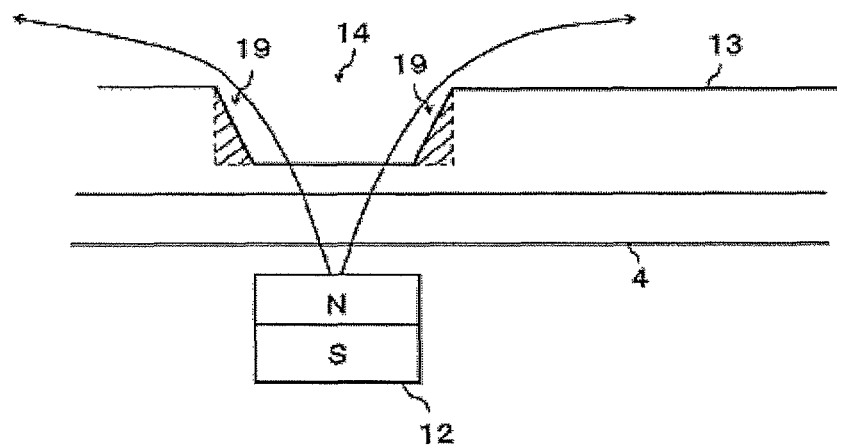
FIG. 7B is an enlarged view of the deposition preventive plate 13 shown in FIG. 6.
Figure 8A:
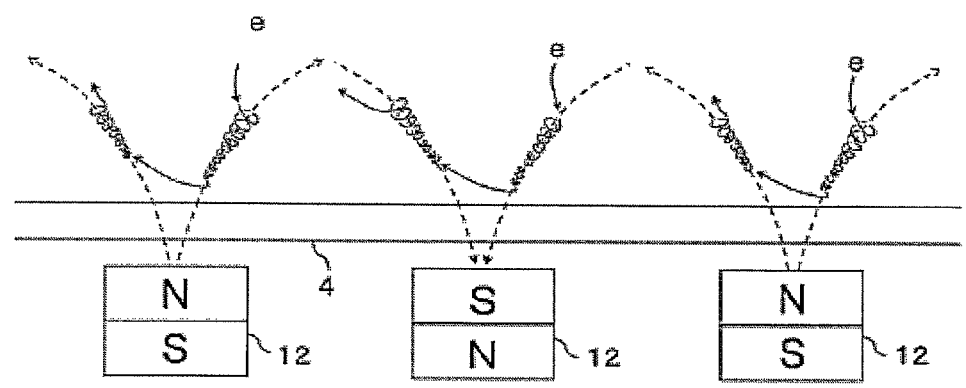
FIGS. 8A and 8B are view showing how electrons e move in cusped magnetic fields formed in the vicinity of a wall surface of a plasma generation chamber.
Figure 8B:
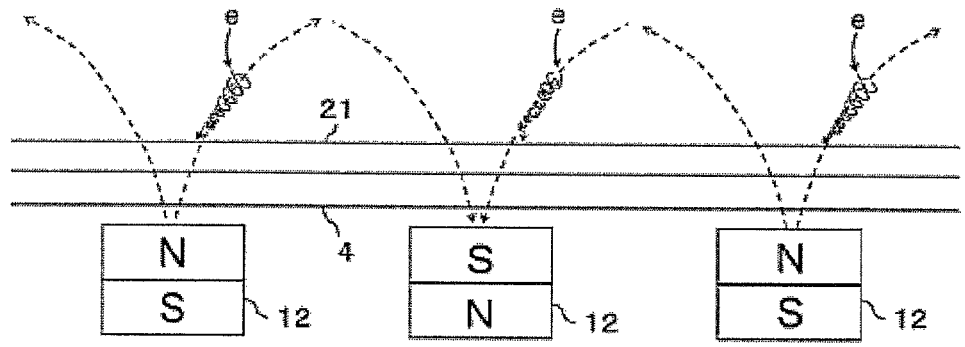

FIG. 7A is an enlarged view of one recess of the deposition preventive plate 13 shown in FIG. 3, and FIG. 7B is an enlarged view of one recess of the deposition preventive plate 13 shown in FIG. 6. As seen from comparison between FIGS. 7A and 7B, the sectional area of the deposition preventive plate 13 can be made larger in the structure of FIG. 7B having the slant faces 19 than in the structure of FIG. 7A by the total area of the portions that are hatched in FIG. 7B. When the sectional area of the deposition preventive plate 13 is increased, the deposition preventive plate 13 is strengthened accordingly. It is therefore expected that adverse effects of a warp etc. due to insufficient strength can be suppressed. In FIGS. 7A and 7B, the arrowed lines extending from the permanent magnets 12 indicate magnetic field lines.

In the embodiment of FIG. 6, each slant face 19 is formed so that the thickness of the deposition preventive plate 13 decreases linearly as the position comes closer to the permanent magnet 12. However, the shape of each slant face 19 is not limited to such a case; each slant face 19 may be formed so that the thickness of the deposition preventive plate 13 decreases nonlinearly as the position comes closer to the permanent magnet 12.

In the embodiments of the invention and the modification shown in FIG. 3 to FIGS. 7A and 7B, each deposition preventive plate 13 is in contact with the associated inner wall surface of the plasma generation chamber 4. Alternatively, a space may be formed between them.

Although in the embodiments and the modification the plasma generation chamber 4 is rectangular in cross section, the invention is not limited to such a case; the plasma generation chamber 4 may be circular or square or have any of other polygonal shapes in cross section. The arrangement of the permanent magnets 12 for formation of cusped magnetic fields is not limited to the one shown in FIGS. 2A and 2B. The number of filaments 10 that are disposed inside the plasma generation chamber 4 may be a number that is larger than or equal to one.

While certain embodiments have been described, these embodiments have been presented by way of example only, and are not intended to limit the scope of the invention. Indeed, the novel device described herein may be embodied in a variety of other fauns; furthermore, various omissions, substitutions and changes in the form of the device, described herein may be made without departing from the sprit of the invention. The accompanying claims and their equivalents are intended to cover such forms or modifications as would fall within the scope and sprit of the invention.

What is claimed is:

1. A bucket-type ion source comprising:
   a plasma generation chamber;
   at least one filament disposed inside the plasma generation chamber;
   at least one electrode disposed so as to be opposed to the plasma generation chamber and configured to extract out an ion beam from the plasma generation chamber;
   a plurality of permanent magnets disposed outside the plasma generation chamber and configured to form cusped magnetic fields inside the plasma generation chamber; and a deposition preventive plate disposed parallel with an inner surface of a wall of the plasma generation chamber, wherein the deposition preventive plate has recesses which are formed at such positions as to be opposed to the respective permanent magnets with the wall of the plasma generation chamber interposed in between, and wherein the deposition preventive plate comprises a first deposition preventive plate having counter bores which are formed at such positions as to be opposed to the respective permanent magnets with the wall of the plasma generation chamber interposed in between and second deposition preventive plates disposed inside the respective counter bores.

2. The bucket-type ion source according to claim 1, wherein the second deposition preventive plates are made of a high-melting point material.

3. A bucket-type ion source comprising:

a plasma generation chamber;

at least one filament disposed inside the plasma generation chamber;

at least one electrode disposed so as to be opposed to the plasma generation chamber and configured to extract out an ion beam from the plasma generation chamber;

a plurality of permanent magnets disposed outside the plasma generation chamber and configured to form cusped magnetic fields inside the plasma generation chamber; and a deposition preventive plate disposed parallel with an inner surface of a wall of the plasma generation chamber, wherein the deposition preventive plate has recesses which are formed at such positions as to be opposed to the respective permanent magnets with the wall of the plasma generation chamber interposed in between, and wherein the deposition preventive plate comprises a first deposition preventive plate having through-holes which are formed at such positions as to be opposed to the respective permanent magnets with the wall of the plasma generation chamber interposed in between and second deposition preventive plates which are disposed between the first deposition preventive plate and the inner wall surface of the plasma generation chamber and close the through-holes.

4. The bucket-type ion source according to claim 3, wherein the second deposition preventive plates are made of a high-melting point material.

5. A bucket-type ion source comprising:

a plasma generation chamber;

at least one filament disposed inside the plasma generation chamber;

at least one electrode disposed so as to be opposed to the plasma generation chamber and configured to extract out an ion beam from the plasma generation chamber;

a plurality of permanent magnets disposed outside the plasma generation chamber and configured to form cusped magnetic fields inside the plasma generation chamber; and a deposition preventive plate disposed parallel with an inner surface of a wall of the plasma generation chamber, wherein the deposition preventive plate has recesses which are formed at such positions as to be opposed the respective permanent magnets with the wall of the plasma generation chamber interposed in between, and wherein the deposition preventive plate comprises a first deposition preventive plate having through-holes which are formed at such positions as to be opposed to the respective permanent magnets with the wall of the plasma generation chamber interposed in between and a second deposition preventive plate which is disposed between the first deposition preventive plate and the inner wall surface of the plasma generation chamber and closes the through-holes.

6. The bucket-type ion source according to claim 5, wherein the second deposition preventive plate is made of a high-melting point material.

\* \* \* \* \*